(12) United States Patent
Haga et al.

(10) Patent No.: US 8,350,371 B2
(45) Date of Patent: Jan. 8, 2013

(54) SEMICONDUCTOR DEVICE AND METHOD OF MANUFACTURING SEMICONDUCTOR DEVICE

(75) Inventors: Motoharu Haga, Kyoto (JP); Shoji Yasunaga, Kyoto (JP); Yasumasa Kasuya, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 253 days.

(21) Appl. No.: 12/662,572

(22) Filed: Apr. 23, 2010

(65) Prior Publication Data
US 2010/0270666 A1    Oct. 28, 2010

(30) Foreign Application Priority Data
Apr. 24, 2009  (JP) .................................. 2009-106906

(51) Int. Cl.
*H01L 23/498*  (2006.01)
*H01L 23/488*  (2006.01)

(52) U.S. Cl. ........ 257/676; 257/578; 257/762; 257/772; 257/E23.023; 257/E23.026; 257/E23.028

(58) Field of Classification Search .................. 257/578, 257/676, 762, 772, E23.023, E23.026, E23.028
See application file for complete search history.

(56) References Cited

U.S. PATENT DOCUMENTS

| 2004/0052678 | A1* | 3/2004 | Takesue et al. ............... 420/562 |
| 2007/0057021 | A1  | 3/2007 | Ikeda et al. |
| 2007/0085187 | A1* | 4/2007 | Sun et al. ....................... 257/686 |
| 2008/0230905 | A1* | 9/2008 | Guth et al. ..................... 257/751 |
| 2009/0159650 | A1  | 6/2009 | Ikeda et al. |

FOREIGN PATENT DOCUMENTS
JP    2007-067158 A    3/2007

* cited by examiner

*Primary Examiner* — Eugene Lee
*Assistant Examiner* — Peniel M Gumedzoe
(74) *Attorney, Agent, or Firm* — Rabin & Berdo, P.C.

(57) ABSTRACT

The semiconductor device according to the present invention includes a semiconductor chip, a solid plate to which the semiconductor chip is bonded, and a bonding member made of a BiSn-based material interposed between the semiconductor chip and the solid plate, while the bonding member has a heat conduction path made of Ag for improving heat conductivity between the semiconductor chip and the solid plate.

24 Claims, 8 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the same.

2. Description of Related Art

Reduction in the quantity of lead used in a semiconductor device has recently been required in view of an environmental load, as proposed by RoHS (Restriction of Hazardous Substances) instructions enforced in July 2006, for example.

In the semiconductor device, lead is used for an external component such as outer plating of an outer lead in a SOP (Small Outline Package) or a QFP (Quad Flat Package) or a solder ball in a BGA (Ball Grid Array), for example, used outside the device, and an internal component such as a bonding member for a semiconductor chip in the package, for example, used in the device.

The external component is generally rendered lead-free so that the lead content therein is not more than a constant ratio, due to studies of substitutional materials. As to the internal component, however, there is no material suitable for substitution. Therefore, a metal such as 95Pb-5Sn (lead content: 95 wt %), for example, having a high lead content is used for the internal component.

SUMMARY OF THE INVENTION

In the process of evaluating metal materials having various compositions as substitutional materials for the internal component, bismuth having a small environmental load is noted as a choosable substitutional material. Bismuth satisfies characteristics such as a melting point, bondability and an environmental load required to a bonding member used in the semiconductor device, for example.

However, the heat conductivity (about 9 W/m·K) of bismuth is lower than the heat conductivity (about 35 W/m·K) of lead. If bismuth is simply used, therefore, heat generated in a semiconductor chip is disadvantageously not easily dissipated.

An object of the present invention is to provide a semiconductor device capable of rendering a bonding member for a semiconductor chip lead-free while sufficiently ensuring heat releasability of the semiconductor chip and a method of manufacturing the same.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
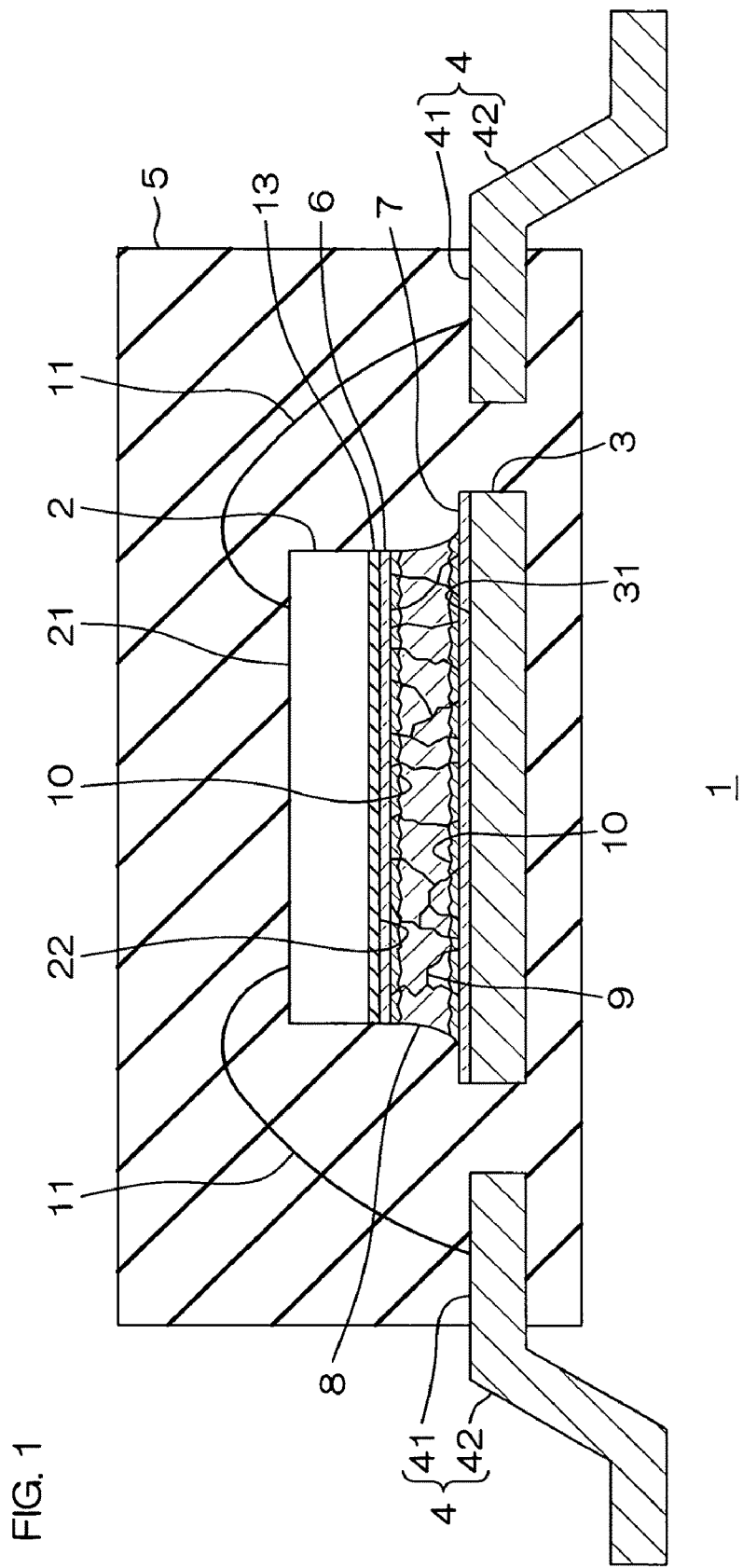
FIG. 1 is a schematic sectional view of a semiconductor device according to an embodiment of the present invention.

A semiconductor device according to an embodiment of the present invention includes a semiconductor chip, a solid plate to which the semiconductor chip is bonded, and a bonding member made of a BiSn-based material interposed between the semiconductor chip and the solid plate, while the bonding member has a heat conduction path made of Ag for improving heat conductivity between the semiconductor chip and the solid plate.

According to the structure, the bonding member bonding the semiconductor chip and the solid plate to each other is made of the BiSn-based material, whereby the bonding member can be rendered lead-free.

Further, the heat conduction path made of Ag connects the semiconductor chip and the solid plate with each other in a heat-conductible manner. Thus, heat can be easily transmitted between the semiconductor chip and the solid plate. Therefore, heat generated in the semiconductor chip can be released to the solid plate through the heat conduction path with the heat conductivity of Ag. Thus, heat releasability of the semiconductor chip can be sufficiently ensured.

Preferably, a metal layer made of an Sn—Ag alloy is formed in the vicinity of the interface between the bonding member and the semiconductor chip and/or the solid plate.

According to the structure, the metal layer made of the Sn—Ag alloy is formed in the vicinity of the interface between the bonding member and the semiconductor chip and/or the solid plate. The Sn—Ag alloy is superior in wettability with respect to a metal to the BiSn-based material. Therefore, bonding strength between the bonding member and the semiconductor chip and/or the solid plate can be improved due to the metal layer.

Preferably, the Sn content in the bonding member is in excess of 0 wt % and not more than 4 wt %.

While Sn is a metal easily alloyable with Ag, unnecessary alloying of Ag contributing to the formation of the heat conduction path can be suppressed when the Sn content in the bonding member is in the aforementioned range. Consequently, the heat conduction path can be efficiently formed.

Further, the bonding member can retain a relatively high melting point due to Bi (melting point: about 270° C.) contained therein in a larger quantity than Sn (melting point: about 232° C.). Therefore, the semiconductor device can exhibit excellent reflow resistance in mounting.

Such a semiconductor device can be manufactured by a method of manufacturing a semiconductor device including a semiconductor chip and a solid plate to which the semiconductor chip is bonded, including the steps of forming a plating layer made of Ag on a bonded surface of at least either the semiconductor chip or the solid plate to either the solid plate or the semiconductor chip, inserting a bonding member made of BiSn whose Sn content is in excess of 0 wt % and not more than 4 wt % between the semiconductor chip and the solid plate after forming the plating layer, and bonding the semiconductor chip and the solid plate to each other using the bonding member by a heat treatment, for example.

According to the method, the bonding member whose Sn content is in excess of 0 wt % and not more than 4 wt % is inserted between the semiconductor chip and the solid plate after the plating layer made of Ag is formed on the bonded surface of the semiconductor chip and/or the solid plate, and thereafter heat-treated. An Ag network (a network structure) reaching another bonded surface from the plating layer can be formed in the bonding member by carrying out the aforementioned steps. Heat conductivity between the semiconductor chip and the solid plate can be improved due to the Ag network.

According to a semiconductor device obtained by the method, the bonding member made of the BiSn-based material can be rendered lead-free.

Further, the semiconductor chip and the solid plate are connected with each other by the Ag network, whereby heat is easily transmitted therebetween. Therefore, heat generated in the semiconductor chip can be released to the solid plate through the heat conduction path with the heat conductivity of Ag. Thus, heat releasability of the semiconductor chip can be sufficiently ensured.

Preferably, the step of forming the plating layer is a step of forming the plating layers on both of the bonded surface of the semiconductor chip and the bonded surface of the solid plate.

According to the method, the plating layers are formed on both of the bonded surface of the semiconductor chip and the bonded surface of the solid plate. Therefore, the density of the Ag network can be increased as compared with a case where the plating layer is formed on only the bonded surface of either the semiconductor chip or the solid plate. Consequently, the heat releasability of the semiconductor chip can be improved.

In the semiconductor device, the solid plate may be an island of a lead frame made of a metal.

According to the structure, the solid plate is the island made of a metal, whereby Ag plating can be easily performed for forming the heat conduction path.

The embodiment of the present invention is now described in detail with reference to the attached drawings.

FIG. 1 is a schematic sectional view of a semiconductor device according to the present invention.

A QFP is applied to a semiconductor chip 1. The semiconductor device 1 includes a semiconductor chip 2, a die pad 3 as a solid plate bonded to the semiconductor chip 2, a plurality of leads 4 electrically connected with the semiconductor chip 2, and a resin package 5 sealing the semiconductor chip 2, the die pad 3 and the leads 4.

The semiconductor chip 2 has a plurality of functional elements therein. The semiconductor chip 2 is in the form of a quadrangular plate having a thickness of 300 μm to 400 μm, for example, and wiring pads (not shown) electrically connected with the functional elements are exposed on a first surface 21 in the thickness direction. On the other hand, a rear metal 13 containing Au, Ni, Ag or the like, for example, is formed on a second surface 22 of the semiconductor chip 2.

A chip plating layer 6 made of Ag is formed on the rear metal 13. The thickness of the chip plating layer 6 is 0.1 μm to 2.0 μm, for example.

The die pad 3 is quadrangularly formed by a thin Cu plate having a thickness of 0.1 mm to 5.0 mm, for example. A pad plating layer 7 made of Ag is formed on a first surface 31 of the die pad 3 in the thickness direction. The thickness of the pad plating layer 7 is 1.0 μm to 10.0 μm, for example.

The semiconductor chip 2 and the die pad 3 are bonded to each other by a bonding member 8 interposed between the second surface 22 and the first surface 31 opposed to each other as bonded surfaces. In other words, the semiconductor chip 2 is supported by the die pad 3 while directing the first surface 21 upward.

The bonding member 8 is made of a BiSn-based material. The BiSn-based material mainly contains BiSn. The BiSn-based material can contain sub-components such as Ag, Sn, Co, Cu, Au, Ni and/or Zn, in order to transmit heat between the semiconductor chip 2 and the die pad 3, improve mechanical physical properties of the bonding member 8, control the melting point of the bonding member 8 and improve wettability of the bonding member 8, for example. The BiSn-based material may contain any one of the sub-components as a single component, or may contain any combination thereof as an alloy of a plurality of metals.

As hereinabove described, the bonding member 8 necessarily contains Sn, and the Sn content in the BiSn-based material is in excess of 0 wt % and not more than 4 wt %, preferably 1 wt % to 3 wt %, more preferably 1.5 wt % to 2.5 wt %, for example.

As one of the aforementioned sub-components, the bonding member 8 has an Ag network 9 as a heat conduction path in contact with both of the chip plating layer 6 and the pad plating layer 7. The Ag network 9 is formed by a large number of spidery spreading thin Ag lines, and generally reaches the overall region of the bonding member 8. The Ag network 9 connects the semiconductor chip 2 and the die pad 3 with each other to be capable of heat conduction ideally with the heat conductivity (about 425 W/m·K) of Ag.

As other sub-components, the bonding member 8 also has alloy layers 10 made of an Sn—Ag alloy in the vicinity of the interfaces between the same and the chip- and pad plating layers 6 and 7. The alloy layers 10 may be entirely or partially formed along the overall regions in the vicinity of the interfaces between the bonding member 8 and the chip- and pad plating layers 6 and 7.

The melting point of the aforementioned bonding member 8 is 260° C. to 270° C., preferably 260° C. to 263° C., for example.

The leads 4 are formed by thin Cu plates (each having a thickness of 0.1 mm to 5.0 mm, for example) identically to the die pad 3, and provided on both sides of the die pad 3 in directions orthogonal to the side surfaces thereof by the same numbers respectively. The leads 4 opposed to the side surfaces of the die pad 3 are arranged at regular intervals in directions parallel to the opposed side surfaces. Each lead 4 integrally includes an inner lead 41 sealed with the resin package 5 and an outer lead 42 exposed from the resin package 5.

The inner lead 41 is arranged on the same plane as the die pad 3, and in the form of a rectangle longitudinal in the direction opposed to the die pad 3. The inner lead 41 is electrically connected with the corresponding wiring pad of the semiconductor chip 2 through a metal wire 11.

The outer lead 42 is generally in the form of a crank having a downwardly bent portion. The outer lead 42 functions as an external connecting portion for mounting the semiconductor device 1 on a printed wiring board.

A well-known material such as epoxy resin can be applied to the resin package 5.

Allowable power dissipation of the aforementioned semiconductor device 1 is 1 W to 10 W, preferably 4 W to 10 W, for example. The allowable power dissipation is regarded as an index of heat releasability of the semiconductor device 1. The semiconductor device 1 can be mounted on the printed wiring board by soldering the outer lead 42 to a land of the printed wiring board and reflowing the same at a temperature of 240° C. to 260° C., for example.

FIGS. 2A to 2D are diagrams showing a method of manufacturing the semiconductor device 1 shown in FIG. 1 in step order.

Figure 2A:
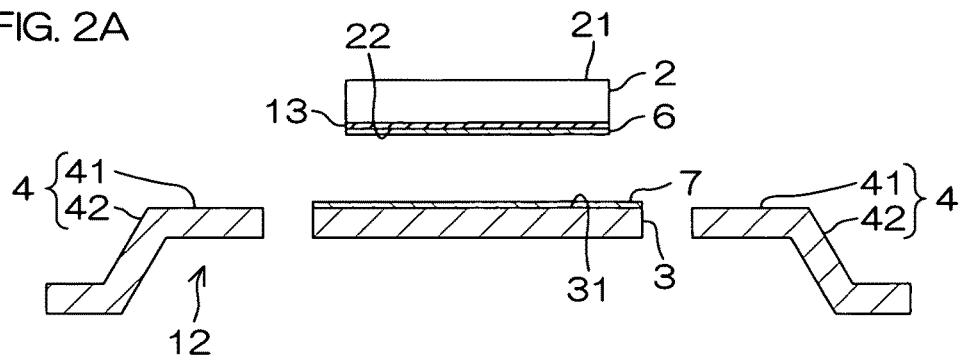
FIGS. 2A to 2D are diagrams showing a method of manufacturing the semiconductor device shown in FIG. 1 in step order.

In order to manufacture the semiconductor device 1, the semiconductor chip 2 and a lead frame 12 are prepared, as shown in FIG. 2A.

The lead frame 12 is formed by working a thin Cu plate. The lead frame 12 integrally includes a latticed frame portion (not shown), the die pad 3 as an island arranged in each rectangular region surrounded by the frame portion, the plurality of leads 4 arranged on the periphery of the die pad 3, and a hanging lead (not shown) extended between the frame portion and the die pad 3.

Then, both of the second surface 22 (the rear metal 13) of the semiconductor chip 2 and the first surface 31 of the die pad 3 are plated with Ag. Thus, the chip plating layer 6 and the pad plating layer 7 are formed. The second surface 22 of the semiconductor chip 2 and the first surface 31 of the die pad 3 may be plated with Ag in the same step or in different steps.

Figure 2B:
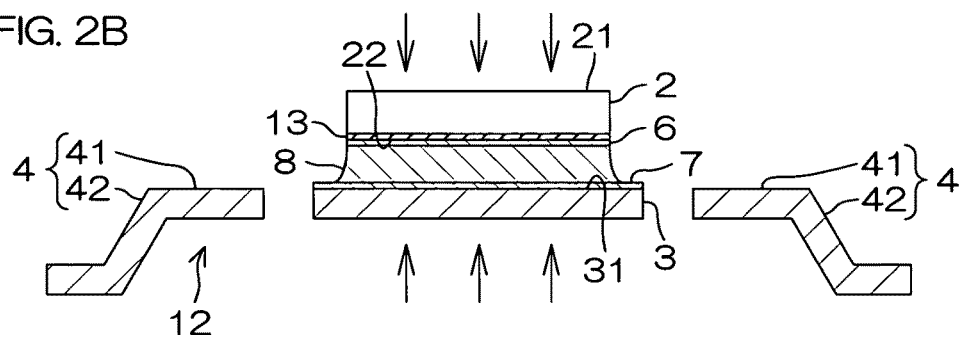

Then, the bonding member 8 made of BiSn is applied onto the pad plating layer 7, and held between the semiconductor chip 2 and the die pad 3 while the chip plating layer 6 is opposed to the bonding member 8, as shown in FIG. 2B.

Figure 2C:
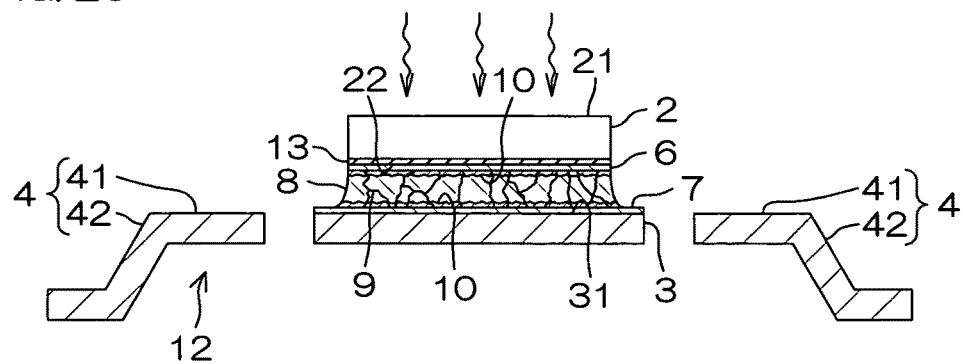

Then, a reflow treatment (a heat treatment) is performed at a temperature of 280° C. to 300° C., for example, as shown in FIG. 2C. Thus, the Ag network 9 and the alloy layers 10 are formed in the bonding member 8, and the semiconductor chip 2 and the die pad 3 are bonded to each other.

Figure 2D:
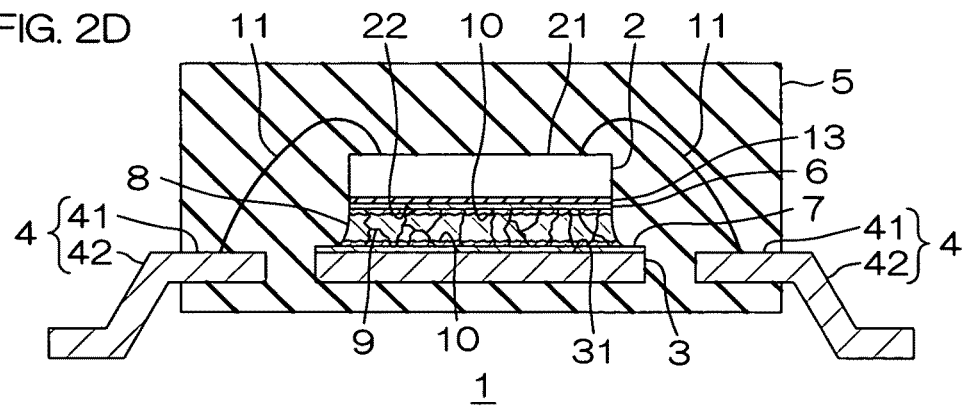

Then, an end of the metal wire 11 is connected to the corresponding wiring pad of the semiconductor chip 2 while another end of the metal wire 11 is connected to the inner lead 41 of the corresponding lead 4, as shown in FIG. 2D.

Then, the lead frame 12 is set in a molding die, and the semiconductor chip 2, the die pad 3, the inner lead 41, the metal wire 11 and part of the hanging lead are sealed with the resin package 5.

Thereafter an unnecessary portion (such as a portion of the hanging lead exposed from the resin package 5, for example) of the lead frame 12 is cut. Thus, each semiconductor device 1 having the structure shown in FIG. 1 is obtained.

According to the aforementioned method, Ag plating layers (the chip plating layer 6 and the pad plating layer 7) are formed on both of the second surface 22 of the semiconductor chip 2 and the first surface 31 of the die pad 3, and the bonding member 8 made of BiSn is thereafter held between the semiconductor chip 2 and the die pad 3 and thereafter reflowed. The Ag network 9 reaching the plating layers 7 and 6 from the plating layers 6 and 7 can be formed in the bonding member 8 by carrying out the aforementioned steps. Heat conductivity between the semiconductor chip 2 and the die pad 3 can be further improved due to the Ag network 9.

In the obtained semiconductor device 1, the bonding member 8 is made of the BiSn-based material, whereby the same can be rendered lead-free.

Further, the semiconductor chip 2 and the die pad 3 are connected with each other by the Ag network 9, whereby heat can be transmitted therebetween. Thus, heat generated in the semiconductor chip 2 can be released to the die pad 3 through the Ag network 9, ideally with the heat conductivity (about 425 W/m·K) of Ag. Therefore, heat releasability of the semiconductor chip 2 can be sufficiently ensured.

Further, the plating layers (the chip plating layer 6 and the pad plating layer 7) made of Ag are formed on both of the second surface 22 of the semiconductor chip 2 and the first surface 31 of the die pad 3, and the spidery Ag network 9 is formed by Ag of the plating layers 6 and 7. Therefore, the density of the Ag network 9 can be increased as compared with a case where a plating layer is formed only on the bonded surface (the second surface 22 or the first surface 31) of the semiconductor chip 2 or the die pad 3. Consequently, the heat releasability of the semiconductor chip 2 can be improved.

The alloy layers 10 made of the Sn—Ag alloy are formed in the vicinity of the interfaces between the bonding member 8 and the chip- and pad plating layers 6 and 7. The Sn—Ag alloy is superior in wettability to the chip plating layer 6 and the pad plating layer 7 to BiSn. Therefore, bonding strength between the semiconductor chip 2 and the die pad 3 can be improved due to the alloy layers 10.

While Sn is a metal easily alloyable with Ag, unnecessary alloying of Ag contributing to the formation of the Ag network 9 can be suppressed when the Sn content in the bonding member 8 is in excess of 0 wt % and not more than 4 wt %. Consequently, Ag of the plating layers 6 and 7 can be so effectively used that the Ag network 9 can be effectively formed.

Further, the bonding member 8 can retain a relatively high melting point (260 to 270° C., for example) due to Bi (melting point: about 270° C.) contained therein in a larger quantity than Sn (melting point: about 232° C.). Therefore, the semiconductor device 1 can exhibit excellent reflow resistance when the same is mounted on the printed wiring board.

EXAMPLES

While the present invention is now described with reference to Examples and comparative examples, the present invention is not restricted to the following Examples and comparative examples.

Examples 1 to 4 and Comparative Examples 1 to 3

Semiconductor devices each having the structure shown in FIG. 1 were prepared according to the aforementioned method. Compositions of bonding members in the semiconductor devices according to Examples 1 to 4 and comparative examples 1 to 3 were designed as follows. In the following compositions, numerals appended to Sn express the contents (wt %) of Sn in the bonding members respectively.

(Composition of Bonding Member)
Example 1: Bi-1Sn
Example 2: Bi-2Sn
Example 3: Bi-3Sn
Example 4: Bi-4Sn
Comparative Example 1: Bi-5Sn
Comparative Example 2: Bi-6Sn
Comparative Example 3: Bi-10Sn
(Evaluation Test)
(1) Photography of SEM Image Electron beams were applied to the bonding members of the semiconductor devices obtained according to Examples 1 to 4 and comparative examples 1 to 3 with a scanning electron microscope (SEM), and formed images were photographed. FIGS. 4 to 10 show the photographs respectively.

Referring to FIGS. 4 to 10, it has been confirmable that Ag networks connecting semiconductor chips and die pads with one another were formed in the bonding members having the Sn contents of 1 to 4 wt % (Examples 1 to 4). On the other hand, it has been confirmed that no Ag networks were formed but Sn was dispersed in Bi in the bonding members having the Sn contents exceeding 4 wt % (comparative examples 1 to 3).

(2) Measurement of Melting Point

The melting points of the bonding members of the semiconductor devices obtained according to Examples 1 to 4 and comparative examples 1 to 3 were measured with a differential scanning thermometer (DSC6200 by Seiko Instruments Inc.). Measurement conditions were set to a rate of temperature increase of 5° C./min. and a temperature range of 115° C. to 300° C., thereby confirming the following as to the bonding members:

Example 1

(Bi-1Sn): The entire bonding member was melted at 263° C.

Example 2

(Bi-2Sn): The entire bonding member was melted at 264.1° C.

Example 3

(Bi-3Sn): 13.2% of the total volume of the bonding member was melted at 139° C.

Example 4

(Bi-4Sn): 48.0% of the total volume of the bonding member was melted at 139° C.

Comparative Example 1

(Bi-5Sn): 81.7% of the total volume of the bonding member was melted at 139° C.

Comparative Example 2

(Bi-6Sn): 93.2% of the total volume of the bonding member was melted at 139° C.

Comparative Example 3

(Bi-10Sn): The entire bonding member was melted at 139° C.

Example 5 and Comparative Examples 4 and 5

Semiconductor devices loaded with transistors were mounted on JEDEC standard substrates (114.3 by 76.2 by 1.6 mm$^3$) with bonding members having compositions shown in Table 1. Each JEDEC standard substrate was formed by superposing three copper foil layers of 74.2 mm square, to have a four-layer structure as a whole. The copper foil layers were connected with one another by thermal vias.

(Evaluation Test)

(1) Measurement of Allowable Power Dissipation

Allowable power dissipation values of the semiconductor devices according to Example 5 and comparative examples 4 and 5 were measured with TH-156 by Shibukawa Kuwano Electrical Instruments Co., Ltd. Table 1 shows the results.

Referring to Table 1, it has been confirmed that the allowable power dissipation of the semiconductor device according to Example 5 employing Bi-2Sn for the bonding member was not ideal but higher than that of the semiconductor device according to comparative example 5 employing Ag paste, although the allowable power dissipation was lower than that of the semiconductor device according to comparative example 4 employing the Pb-containing bonding member. Thus, it has been confirmed that the semiconductor device according to Example 5 has sufficient heat releasability.

TABLE 1

|  | Bonding Member | Allowable Power Dissipation (W) |
|---|---|---|
| Example 5 | Bi—2Sn | 4.8 |
| Comparative Example 4 | Pb—3Sn—1Ag | 5.4 |
| Comparative Example 5 | Ag Paste | 4.6 |

While the embodiment of the present invention has been described, the present invention may be embodied in other ways.

Figure 3:
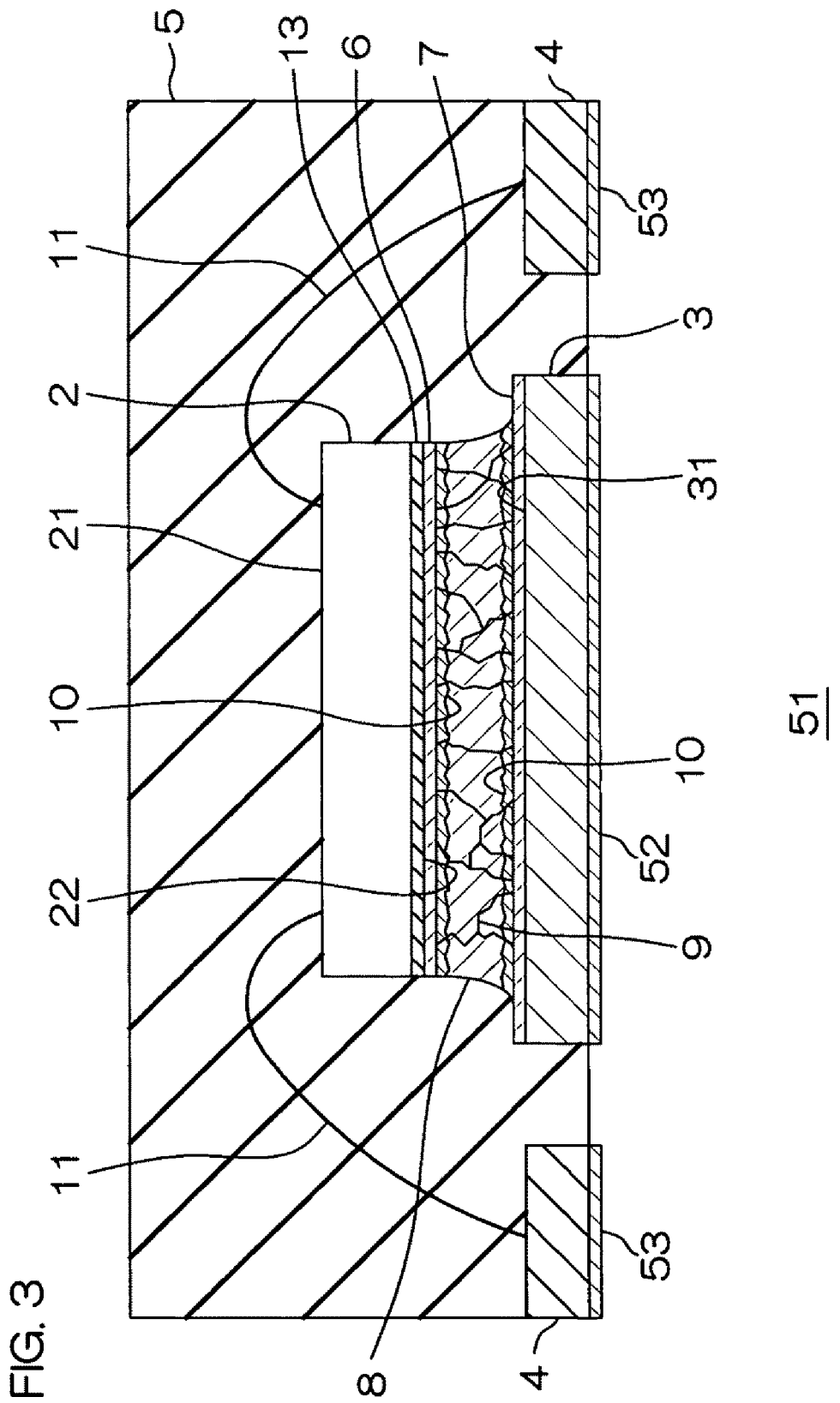
FIG. 3 is a schematic sectional view of a semiconductor device (a QFN type) according to a modification of the present invention.
Figure 4:
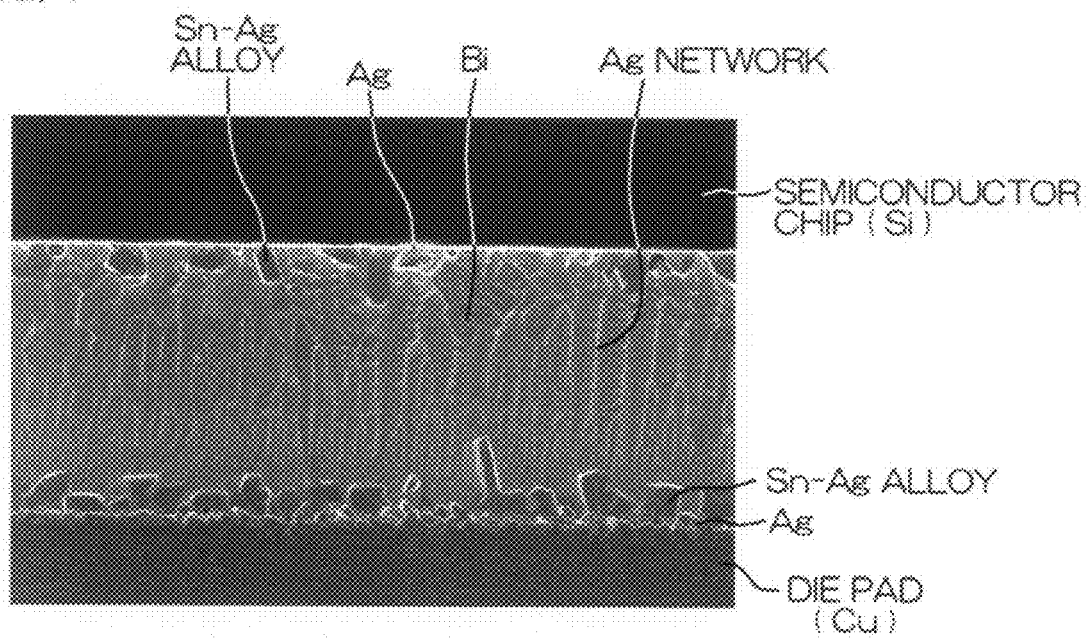
FIG. 4 is an SEM photograph of a semiconductor device according to Example 1.
Figure 5:
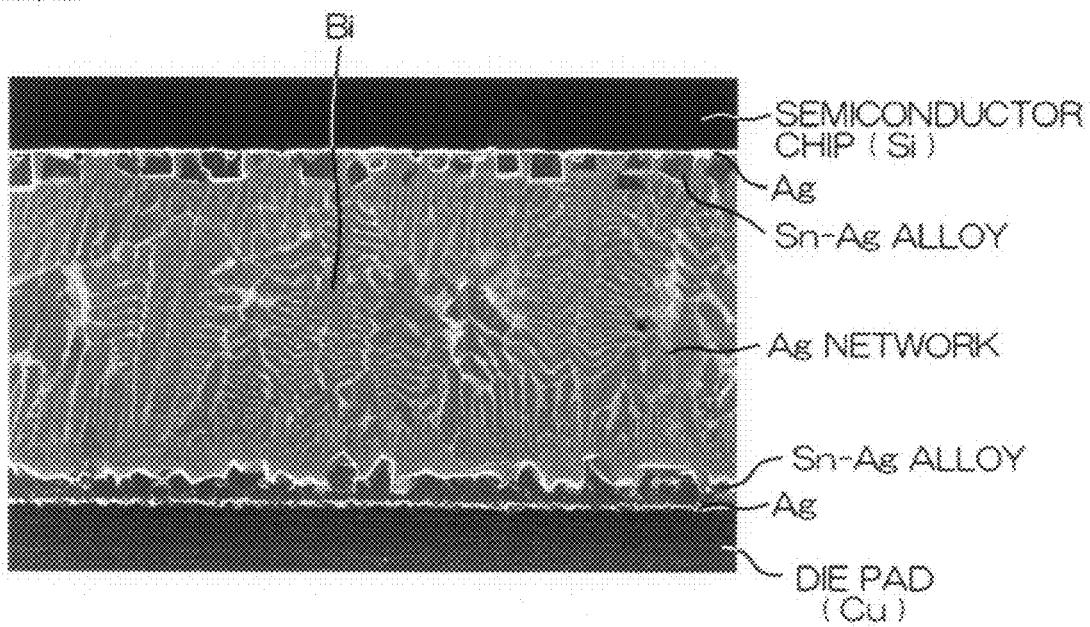
FIG. 5 is an SEM photograph of a semiconductor device according to Example 2.
Figure 6:
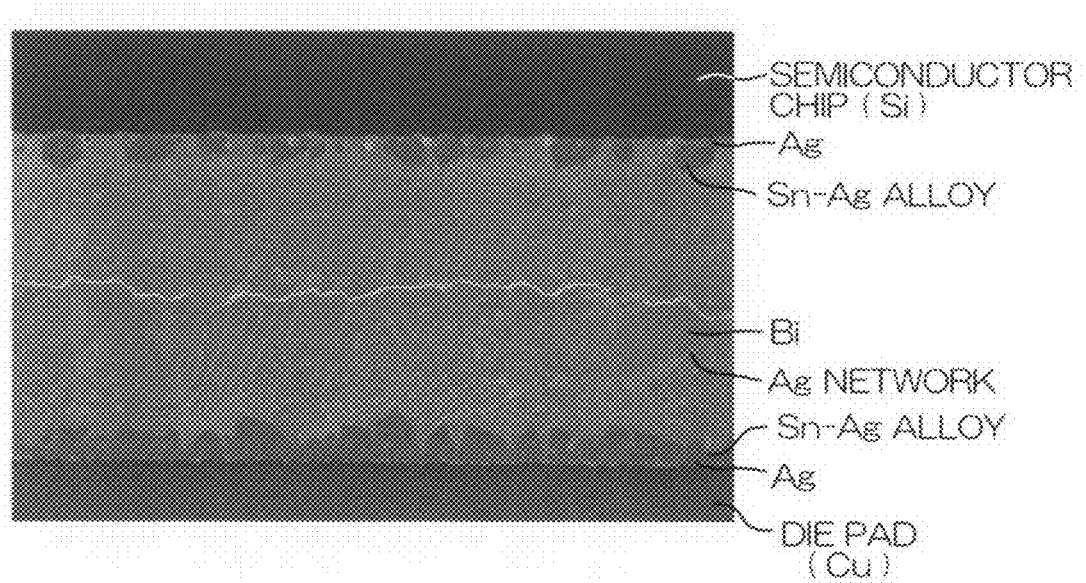
FIG. 6 is an SEM photograph of a semiconductor device according to Example 3.
Figure 7:
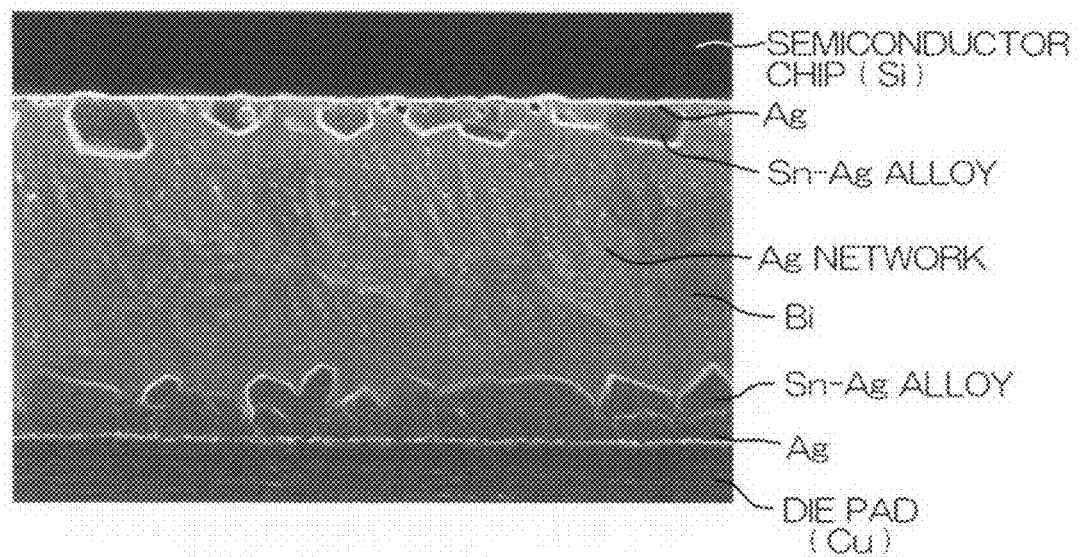
FIG. 7 is an SEM photograph of a semiconductor device according to Example 4.
Figure 8:
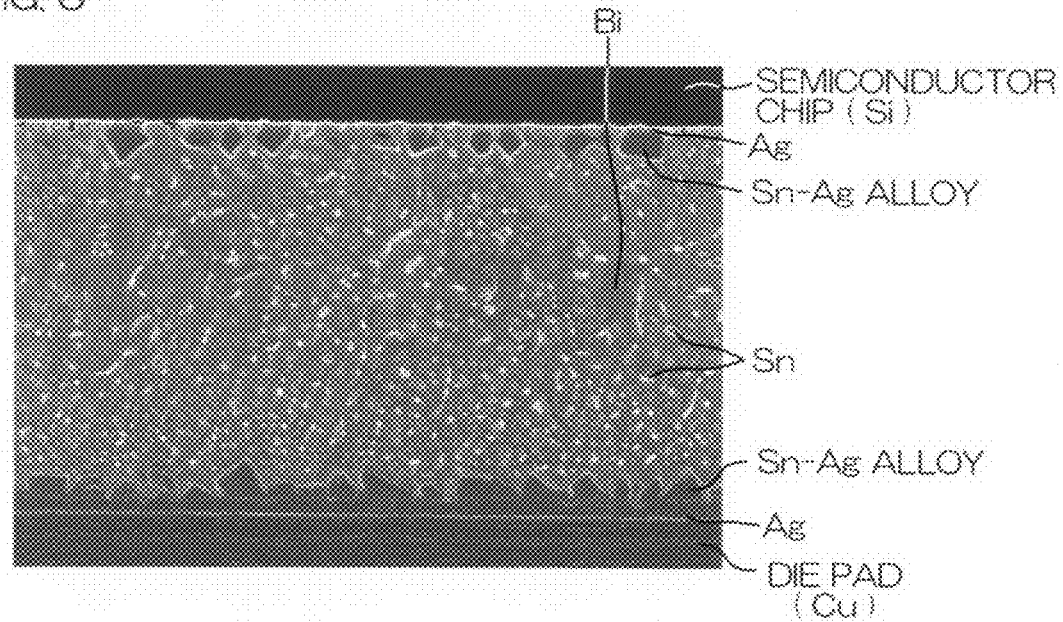
FIG. 8 is an SEM photograph of a semiconductor device according to comparative example 1.
Figure 9:
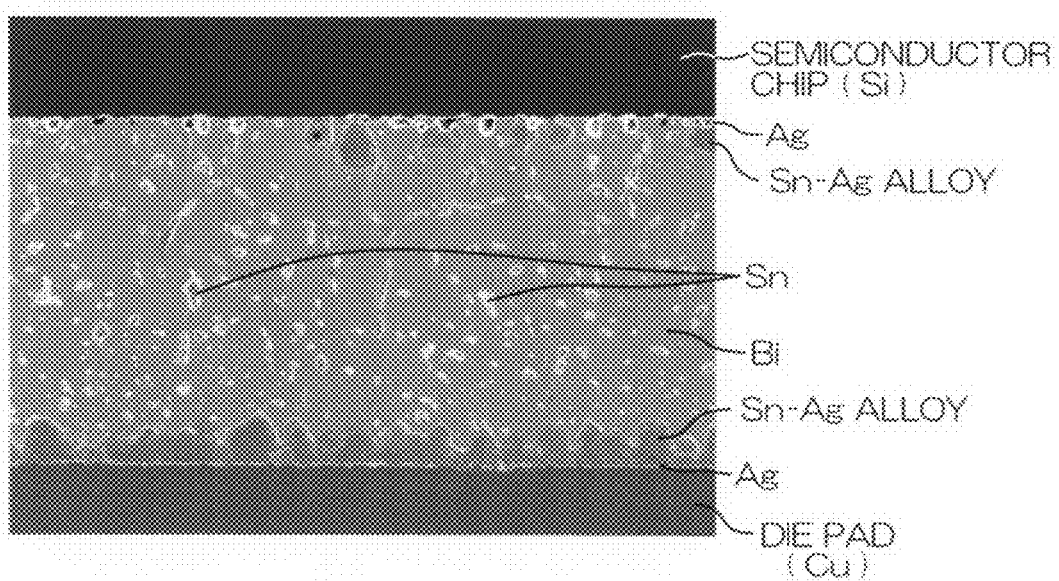
FIG. 9 is an SEM photograph of a semiconductor device according to comparative example 2.
Figure 10:
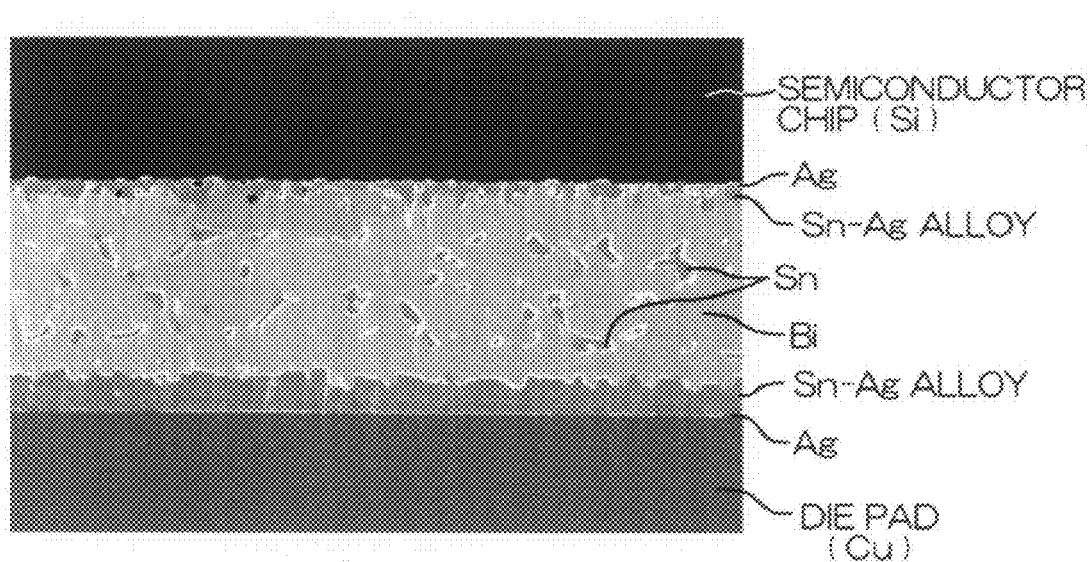
FIG. 10 is an SEM photograph of a semiconductor device according to comparative example 3.

For example, while the semiconductor device 1 to which the QFP is applied has been described, the present invention is also applicable to a semiconductor device 51 (referring to FIG. 3, numerals 52 and 53 denote plating layers made of a metal such as tin (Sn) or a tin-silver alloy (Sn—Ag), for example) to which a QFN is applied as shown in FIG. 3, or a semiconductor device to which still another type of package such as a BGA or a SOP is applied, for example.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-106906 filed with the Japan Patent Office on Apr. 24, 2009, the disclosure of which is incorporated herein by reference.

What is claimed is:

1. A semiconductor device comprising:
a semiconductor chip;
a solid plate to which the semiconductor chip is bonded; and
a bonding member of a BiSn-based material interposed between the semiconductor chip and the solid plate, wherein
the bonding member has a heat conduction path of Ag for improving heat conductivity between the semiconductor chip and the solid plate,
the heat conduction path spreading continuously, a length of the heat conduction path occupying at least 30% of a distance between the semiconductor chip and the solid plate.

2. The semiconductor device according to claim 1, wherein a vicinity of an interface between the bonding member and the semiconductor chip and/or between the bonding member and the solid plate has a metal layer of an Sn—Ag alloy.

3. The semiconductor chip according to claim 1, wherein the Sn content in the bonding member is in excess of 0 wt % and not more than 4 wt %.

4. The semiconductor chip according to claim 3, wherein the Sn content in the bonding member is in excess of 1 wt % and not more than 3 wt %.

5. The semiconductor chip according to claim 3, wherein the Sn content in the bonding member is in excess of 1.5 wt % and not more than 2.5 wt %.

6. The semiconductor device according to claim 1, wherein the solid plate is an island of a lead frame of a metal.

7. The semiconductor chip according to claim 1, wherein the semiconductor chip is in the form of a quadrangular plate having a thickness of 300 μm to 400 μm.

8. The semiconductor chip according to claim 1, wherein the bonding member mainly contains BiSn.

9. The semiconductor chip according to claim 1, wherein the semiconductor chip has a rear metal containing Au, Ni or Ag on a surface of the semiconductor chip on a side of the bonding member.

10. The semiconductor device according to claim 9, wherein the rear metal has a chip plating layer of Ag.

11. The semiconductor device according to claim 10, wherein the thickness of the chip plating layer is 0.1 μm to 2.0 μm.

12. The semiconductor device according to claim 1, wherein
the solid plate is a die pad for die-bonding the semiconductor chip, and
the die pad has a pad plating layer having a thickness of 1.0 μm to 10.0 μm on the die pad.

13. The semiconductor device according to claim 1, wherein the bonding member contains Bi in a larger quantity than Sn.

14. The semiconductor device according to claim 1, wherein the bonding member contains a sub-component consisting of at least one of Ag, Sn, Co, Cu, Au, Ni and Zn.

15. The semiconductor device according to claim 1, wherein the bonding member has a melting point of 260° C. to 270° C.

16. The semiconductor device according to claim 15, wherein the bonding member has a melting point of 260° C. to 263° C.

17. The semiconductor device according to claim 1, wherein
the solid plate is a die pad for die-bonding the semiconductor chip,
the semiconductor chip is electrically connected with a plurality of leads arranged around the periphery of the die pad, and
the plurality of leads are formed by thin Cu plates identical to the die pad.

18. The semiconductor device according to claim 17, wherein each of the leads has a thickness of 0.1 mm to 5.0 mm.

19. The semiconductor device according to claim 1, wherein the bonding member includes Bi-2Sn.

20. The semiconductor device according to claim 1, wherein the heat conduction path is a network structure spreading in the bonding member.

21. The semiconductor device according to claim 1, wherein the heat conduction path is a spidery heat conduction path that spreads in the bonding member.

22. The semiconductor device according to claim 21, wherein the spidery heat conduction path reaches almost all of the bonding member.

23. The semiconductor device according to claim 22, wherein the length of the spidery heat conduction path occupies at least 60% of the distance between the semiconductor chip and the solid plate.

24. The semiconductor device according to claim 1, wherein the heat conduction path spreads straight forward on a direction from the semiconductor chip to the solid plate and the length of the heat conduction path occupies at least 60% of the distance between the semiconductor chip and the solid plate.

* * * * *